United States Patent
Jeon

(10) Patent No.: US 6,744,196 B1
(45) Date of Patent: Jun. 1, 2004

(54) THIN FILM LED

(75) Inventor: Hyeong Tag Jeon, Seoul (KR)

(73) Assignee: Oriol, Inc., Santa Clara, CA (US)

( * ) Notice: Subject to any disclaimer, the term of this patent is extended or adjusted under 35 U.S.C. 154(b) by 0 days.

(21) Appl. No.: 10/316,004

(22) Filed: Dec. 11, 2002

(51) Int. Cl.$^7$ .................................................. H01J 1/62
(52) U.S. Cl. ........................ 313/498; 313/506; 313/512
(58) Field of Search ................................. 313/498, 506, 313/512

(56) References Cited

U.S. PATENT DOCUMENTS 6,337,536 B1 * 1/2002 Matsubara et al.

* cited by examiner

Primary Examiner—Vip Patel
(74) Attorney, Agent, or Firm—McKenna Long & Aldridge LLP

(57) ABSTRACT

Light emitting LEDs devices comprised of LED chips that emit light at a first wavelength, and a tinted thin film layer over the LED chip that changes the color of the emitted light. For example, a blue-light emitting LED chip can be used to produce white light. The tinted thin film layer beneficially consists of ZnSe, $CeO_2$, $Al_2O_3$, or $Y_2O_3$:Ce that is deposited using a chemical vapor deposition process, such as metal organic chemical vapor deposition (MOCVD), atomic layer chemical vapor deposition (ALD), plasma enhanced MOCVD, plasma enhanced ALD, and/or photo enhanced CVD. Suitable CVD precursors include Alkoxide, β-dikeonate, Metalloscene, Alkys, DMZn, DEZe, $H_2Se$, DMSe, TbuSe, and DESe.

39 Claims, 5 Drawing Sheets

THIN FILM LED

BACKGROUND OF THE INVENTION

1. Field of the Invention

The present invention relates to light emitting diodes (LEDs). More particularly, this invention relates to light emitting LEDs having active layers that produce light at one wavelength, but that emit light at another wavelength.

2. Discussion of the Related Art

Light emitting diodes ("LEDs") are well-known semiconductor devices that convert electrical current into light. An LED produces light by exciting electrons across the band gap between a conduction band and a valence band of a semiconductive active (light-emitting) layer. That electron transition generates light at a wavelength (color) that depends on the band gap. Thus, the color of the light (wavelength) emitted by an LED depends on the semiconductor material(s) of the active layer.

LEDs are widely available in a range of colors, for example, red, green, blue, yellow, and orange. However, conventional LEDs are relatively monochromatic light sources. Unfortunately, some applications require white light, which includes all primary colors. For example, laptop computers often require white-light backlights. Usually, white light is supplied either by incandescent bulbs or by fluorescent lamps. Although inexpensive, incandescent bulbs have fairly short lifetimes and low luminous efficiency. While more efficient, fluorescent lamps also tend to have limited lifetimes. Furthermore, fluorescent lamps require relatively large, heavy and expensive support devices, such as voltage stabilizers.

A white-light LED source could be made by fabricating closely spaced (or otherwise light-mixed) red, green, and blue LEDs that emit light in proper proportions. However, blue LEDs have been relatively difficult to fabricate, primarily because of difficulties in fabricating high quality crystals having a suitable band gap. Despite these difficulties, blue GaN-based LEDs have recently become commercially available. This has enabled white-light LEDs to actually be fabricated by mixing green, red and blue light together.

While successful in producing white light, three-component (green, red and blue) LEDs have problems. For example, three-component LEDs will use significantly more power than a single component LED. Additionally, three-component LEDs require careful balancing of optical outputs to achieve high quality white light, a balance that is difficult to maintained over time and temperature and that requires careful and expensive fabrication. The necessity of optical balancing combined with a relatively complicated drive circuitry means that three-component LEDs are, in practice, difficult and expensive to fabricate.

Because of the forgoing problems with three-component LEDs it is would be advantageous to produce white light using only a single-element LED. Such single element white-light emitting LEDs are known. For example, FIG. 1 illustrates a prior art single-element, white-light LED 12. That LED incorporates a yttrium-aluminum garnet (YAG) phosphor. Essentially, the phosphor layer produces white light from blue light. As shown, the single element white-light LED 12 is comprised of a blue-light emitting LED chip 14 that is located on a base 15, which is inside an organic YAG phosphor 16. The YAG phosphor 16 is embedded in a dome-shaped package 17 having a hemispherical top 18. The package 17 protects the resulting LED from damage caused by static electricity, moisture, and other environmental influences. Extending from the package 17 are two leads 20 and 22. Bonding wires 24 and 26 connect the anode and cathode of the LED chip 14 to the leads 20 and 22.

Still referring to FIG. 1, when electric power is applied to the LED chip 14 via the leads 20 and 22 and the bonding wires 24 and 26, the LED chip 14 emits blue-light into the YAG phosphor 16. In response, white light is emitted from the package 17.

Thus, a key to making white-light LEDs using the method illustrated in FIG. 1 is to fabricate suitable blue-light emitting LEDs. A beneficial approach to fabricating blue-light emitting LEDs is to incorporate active layers comprised of Gallium-Nitride (GaN) and Indium to produce InGaN/GaN semiconductor layers. In fact, the energy efficiency of GaN-based white light emitting LEDs has surpassed that of incandescent lamps, and is now comparable with that of fluorescent lamps.

Despite their numerous advantages, white-light emitting LEDs similar to the one shown in FIG. 1 have problems. One set of problems relates to degradation of the bonding wires 24 and 26, the LED chip 14, and the leads 20 and 22 due to direct contact and subsequent chemical reaction with the YAG phosphor 16. Additionally, the YAG phosphor 16 can be degraded by such chemical reactions.

Another problem with white-light emitting LEDs similar to the one shown in FIG. 1 is that the hemispherical top 18 of the package 17 results in a "ring pattern" in the emitted light. Thus, the emitted light has poor luminance uniformity. The hemispherical top 18 also makes it difficult to reliably coat phosphors inside the package if such coating is required.

Another serious problem with white-light emitting LEDs similar to the one shown in FIG. 1 is that the actual production of white light does not come from the light-producing LED chip 14, which emits only blue light, but from phosphor 16 within the package 17. Thus, the package not only provides protection, it is a functional requirement. This makes it difficult to form surface mounted devices.

U.S. Pat. No. 6,337,536, by inventors Matsubara et al., which issued on Jan. 8, 2002, and which is entitled, "White color light emitting diode and neutral color light emitting diode," discloses a white-light emitting source that uses an n-type ZnSe single crystal substrate. That substrate is doped with I, Cl, Br, Al, Ga, or In emission centers, and includes an epitaxial film active layer structure of ZnSe, ZnCdSe or ZnSeTe. The active layer emits blue or blue-green light. The emission centers convert the blue or blue-green light to yellow or orange. The blue or blue-green light and the yellow or orange light synthesize white light or a neutral color light between red and blue.

While the techniques taught in U.S. Pat. No. 6,337,536 are generally successful, they have problems. For example, U.S. Pat. No. 6,337,536 teaches a thick substrate. Therefore, the light intensity is heavily dependent on the thickness of the substrate. Furthermore, the materials used in U.S. Pat. No. 6,337,536 may not be optimal in specific applications.

Therefore, a new single-element, white-light LED would be beneficial. Particularly beneficial would be a single-element, white-light LED that reduces or eliminates bonding wire, LED chip, connector lead, and phosphor degradation. Also beneficial would be a single-element, white-light LED that does not produce a ring pattern and that improves the uniformity of emitted light. Such a single-element, white-light LED would beneficially be fabricated as an on-chip, single-element, white-light LED that does not require a package for white light emissions. A method of fabricating white-light emitting diodes without coating phosphor inside packages would be useful. Also beneficial would be a single-element, white-light LED with a light output that does not depend on the thickness of a substrate. More generally, a method of fabricating light emitting diodes using tinted thin film coatings would be beneficial.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The principles of the present invention provide for white-light LEDs and for methods of fabricating white-light LEDs. Embodiments of white-light LEDs that are in accord with the principles of the present invention have reduced or eliminated bonding wire, LED chip, lead, and/or phosphor degradation. Such white-light LEDs can be fabricated on-chip, with improved light uniformity, and in such a manner that the light output is not heavily dependent on the thickness of a substrate.

According to the broad principles of the present invention, an LED element that produces light at a first wavelength and having p and n contacts is fabricated on a substrate. Then, a tinted thin film covers the LED element. A passivation layer is located on the LED element, but in such a manner that the p and n contact pads are exposed. Electrical power applied to the p and n contacts causes the LED element to emit light at the first wavelength. The tinted thin film interacts with light at the first wavelength to produce light having at least a second wavelength.

According to the principles of the present invention a white-light LED includes a blue-LED element that includes p and n contact pads. A tinted thin film of a yellow color material, such as ZnSe, CeO2, $Al_2O_3$, $Y_2O_3$:Ce covers the blue-LED element. Such thin film materials are beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods. A passivation layer, beneficially about a 1000 Å-thick $SiO_2$ or $Si_xN_y$ layer, can be located on the blue-LED element, but in such a manner that the p and n contact pads are exposed.

The thin film yellow color material can be formed using metal precursors of metal halide sources and metal organic precursors of Alkoxide, β-dikeonate, Metalloscene, and Alkys. For example, Zn can be from one of the Zn precursors of DMZn, DEZn, $ZnCl_2$, etc while a Se source could be one of Se precursors of $H_2Se$, DMSe, DESe, $SeCl_4$, TbuSe, etc.

The passivation layer can be formed using PECVD, sputtering, electron beam evaporation, or coating with a material, such as epoxy or flowable $SiO_2$. PECVD is particularly beneficial in that it provides protected sidewalls. Spin-coating is a useful method of material coating. The passivation layer can then be patterned to expose the p and n contact pads using photolithography and a suitable etchant (such a BOE, HF, and/or photo-resist stripping).

Wire bonds connect to the p and n contact pads. A second passivation layer can be formed over the p and n pads, over ends of the wire bonds, and over the first passivation layer. The result is an on-chip, single-element, white-light LED that is capable of emitting white-light without being encapsulated. Furthermore, that an on-chip, single-element, white-light LED can be formed without a ring-patterned light. However, the resulting on-chip, single-element, white-light LED could be encapsulated in a package (such as a lamp or surface mount package) as required.

According to the principles of the present invention, an LED includes a LED element that includes p and n contact pads and that emits light at a first wavelength. A tinted thin film material (such as ZnSe, $CeO_2$, $Al_2O_3$, $Y_2O_3$:Ce) covers the LED element. Such thin film materials are beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods. A passivation layer, beneficially about a 1000 Å-thick $SiO_2$ or $Si_xN_y$ layer, can be located on the LED element, but in such a manner that the p and n contact pads are exposed. The fluorescing material then converts light at the first wavelength that is emitted by the LED element into at least a second wavelength.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE ILLUSTRATED EMBODIMENTS

The following generally describes a process for fabricating on-chip white LEDs. While that description is an advantageous method of fabricating white LEDs, the principles of the present invention are not limited to that described method. Accordingly, the present invention is to be limited only by the claims that follow as understood and interpreted according to United States Patent Laws.

Figure 1:
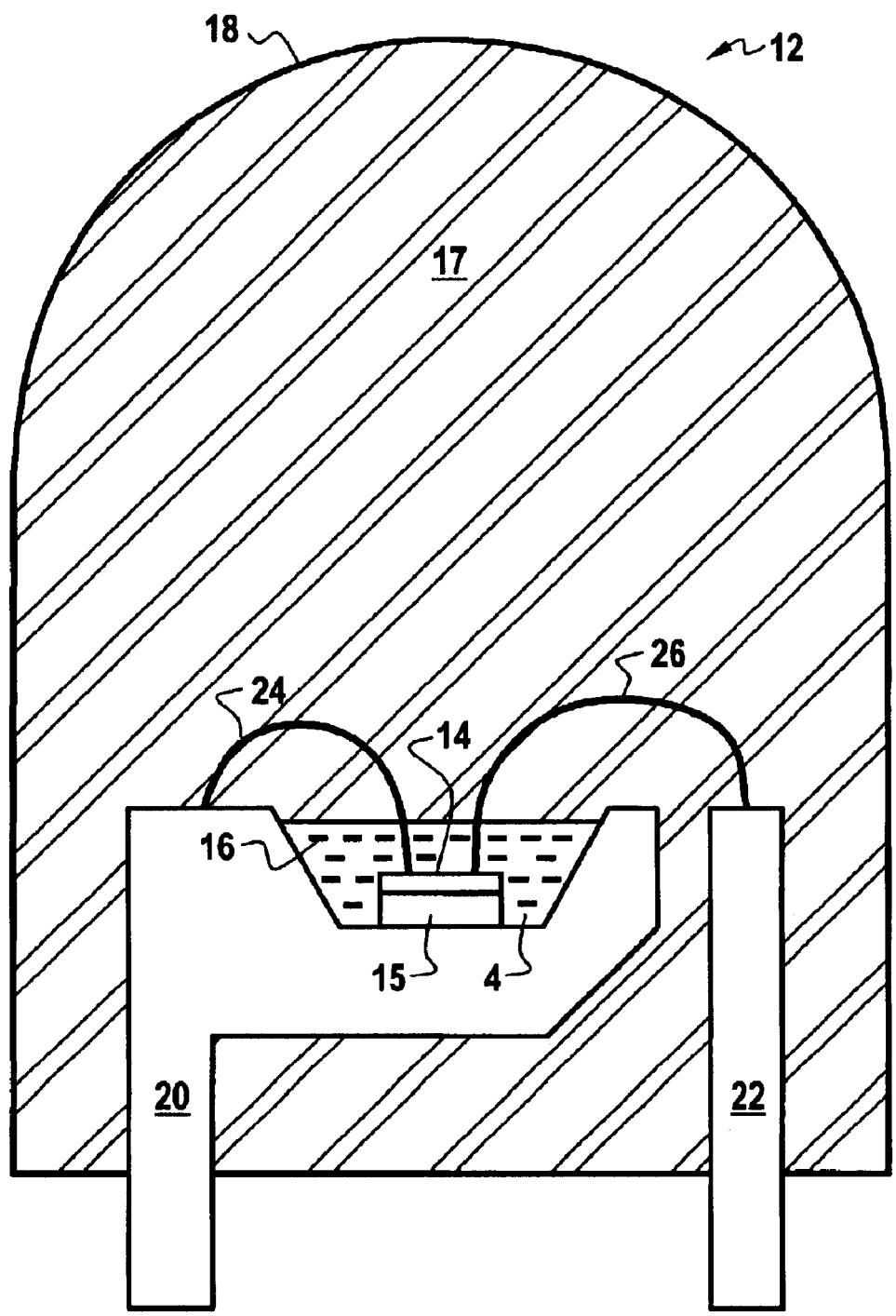
FIG. 1 illustrates a prior art white-light LED.
Figure 2:
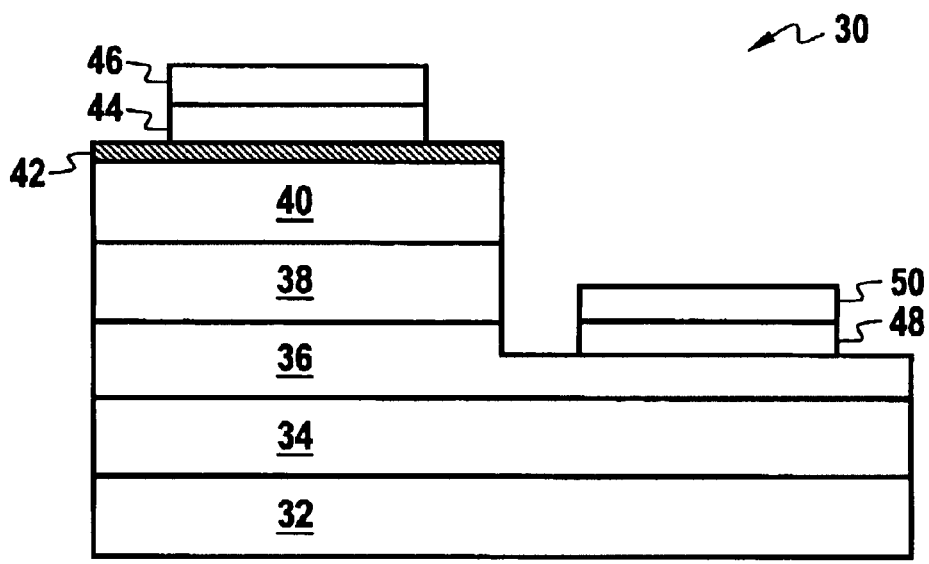
FIG. 2 illustrates a prior art lateral topology blue-light LED.
Figure 3:
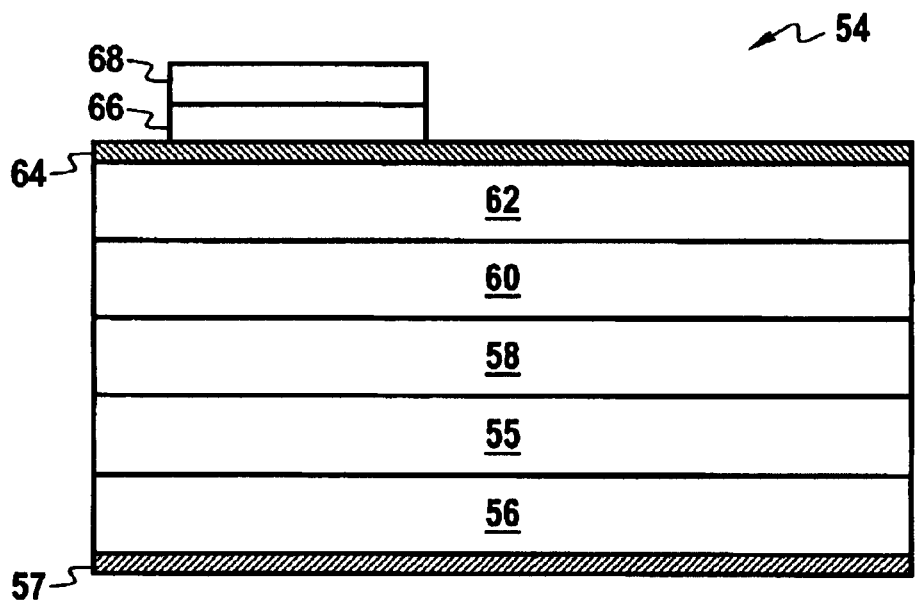
FIG. 3 illustrates a prior art vertical topology blue-light LED.

Fabrication of a white-light emitting diode that is in accord with the principles of the present invention begins with procurement of, such as by fabrication, a blue-LED chip having p and n contact pads. FIGS. 2 and 3 illustrate suitable blue-LED chips. In particular, FIG. 2 illustrates a lateral topology blue-LED chip 30 that is fabricated on a sapphire substrate 32. An n-GaN buffer layer 34 is formed on the substrate 32. A relatively thick n-GaN epitaxial layer 36 is then formed on the buffer layer 34. An active layer 38 having multiple quantum wells of aluminum-indium-gallium-nitride (AlInGaN) or of InGaN/GaN is then formed on the n-type GaN epitaxial layer 36. A p-GaN layer 40 is then formed on the active layer 38. A transparent conductive layer 42 is then formed on the p-GaN layer 40. The transparent conductive layer 42 may be made of any suitable material, such as Ru/Au, Ni/Au or indium-tin-oxide (ITO). A p-type electrode 44 is then formed on one side of the transparent conductive layer 42. Suitable p-type electrode materials include Ni/Au, Pd/Au, Pd/Ni and Pt. A p contact pad 46 is then formed on the p-type electrode 44. Beneficially, the p contact pad 46 is Au. The transparent conductive layer 42, the p-GaN layer 40, the active layer 38 and part of the n-GaN layer 36 are then etched to form a step. Because of the difficulty of wet etching GaN, a dry etch is usually used to form the step. The LED 30 is then completed by forming an n-electrode pad 48 (possible Cr or Au) and an n contact pad 50 (usually Au) on the step.

FIG. 3 illustrates an alternative blue-light emitting LED, specifically a vertical topology GaN-based LED 54. The LED 54 is partially fabricated on a sapphire substrate that is subsequently removed. Removal of sapphire substrates is known in the art, for example, by laser lift off (references are provided subsequently). As shown, the LED 54 includes a GaN buffer layer 55 having an n-metal contact 56 on a bottom surface and a relatively thick n-GaN layer 58 on the other. The n-metal contact 56 is beneficially formed from a high reflectively layer that is overlaid by a high conductivity metal (beneficially Au) to form an n contact pad 57. An active layer 60 having multiple quantum wells is formed on the n-type GaN layer 58, and a p-GaN layer 62 is formed on the active layer 60. A transparent conductive layer 64 is then formed on the p-GaN layer 62, and a p-type electrode 66 is formed on the transparent conductive layer 64. A p contact pad 68 is then formed on the p-type electrode 66.

The vertical GaN-based LED 54 as the advantage that step etching is not required. However, to locate the n-metal contact 56 below the GaN buffer layer 55 the sapphire substrate (not shown) that is used for initial GaN growth has to be removed. Such removal can be difficult, particularly if device yields are of concern. However, sapphire substrate removal using laser lift off is known, reference U.S. Pat. No. 6,071,795 to Cheung et al., entitled, "Separation of Thin Films From Transparent Substrates By Selective Optical Processing," issued on Jun. 6, 2000, and Kelly et al. "Optical process for liftoff of group III-nitride films", Physica Status Solidi (a) vol. 159, 1997, pp. R3–R4). Furthermore, highly advantageous methods of fabricating GaN semiconductor layers on sapphire (or other insulating and/or hard) substrates are taught in U.S. patent application Ser. No. 10/118, 317 entitled "A Method of Fabricating Vertical Devices Using a Metal Support Film" and filed on Apr. 9, 2002 by Myung Cheol Yoo, and in U.S. patent application Ser. No. 10/118,316 entitled "Method of Fabricating Vertical Structure" and filed on Apr. 9, 2002 by Lee et al. Additionally, a method of etching GaN and sapphire (and other materials) is taught in U.S. patent application Ser. No. 10/118,318 entitled "A Method to Improve Light Output of GaN-Based Light Emitting Diodes" and filed on Apr. 9, 2002 by Yeom et al. All of those United States Patent documents are hereby incorporated by reference.

In principle, the vertical GaN-based LED 54 is preferred. Reasons for this include the fact that a 2" diameter sapphire wafer can produce about 35,000 vertical GaN-based LEDs, but only about 12,000 lateral GaN-based LEDs. Furthermore, the lateral topology is more vulnerable to static electricity, primarily because the two electrodes/pads (44/46 and 48/50) are close together. Additionally, as the lateral topology is fabricated on an insulating substrate, and as the vertical topology can be attached to a heat sink, the lateral topology has relatively poor thermal dissipation.

While the vertical GaN-based LED 54 will be preferred in many applications, at the present time lateral topology blue-LED chips 30 are more common. Furthermore, the principles of the present invention are fully applicable to both types of blue LEDs (as well as with hybrids and variations). Therefore, without implying any loss of generality, the subsequent description of the fabrication of single-element white-light LEDs will make specific reference to the use of a lateral blue-LED chip 30.

Figure 4:
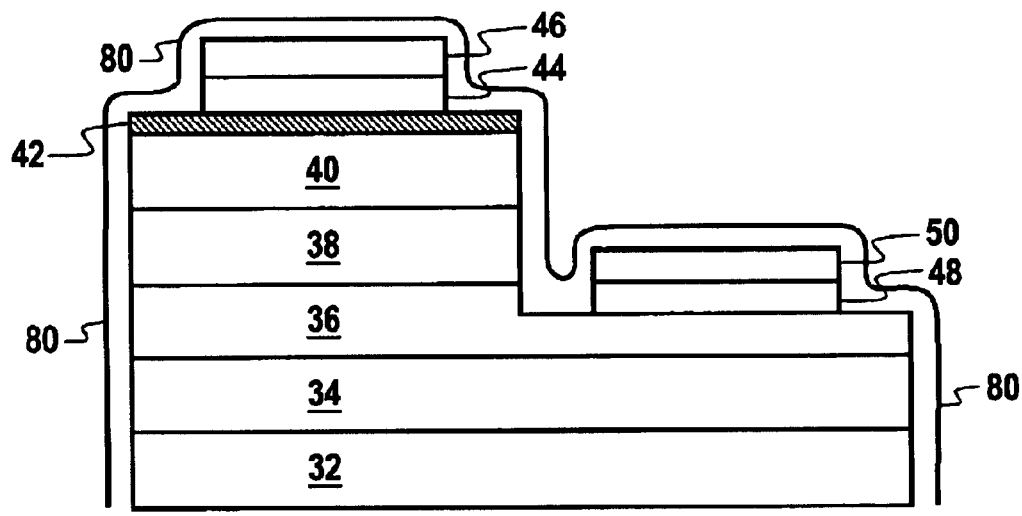
FIG. 4 illustrates a vertical topology, blue-light LED after coating with a passivation material.

Referring now to FIG. 4, a passivation layer 80 is formed over the blue-LED chip 30. A suitable passivation layer 80 might be a 1000 Å-thick $SiO_2$ or $Si_xN_y$ layer formed on exposed surfaces of the LED chip 30 using PECVD. Alternatively, the passivation layer could be formed by sputtering, electron beam evaporation, or by coating with a suitable protective material, such as epoxy or flowable $SiO_2$. Note that spin-coating is a particularly useful coating technique. However, PECVD is beneficial because it can form the passivation layer 80 on the sidewalls of the blue-LED chip 30.

Figure 5:
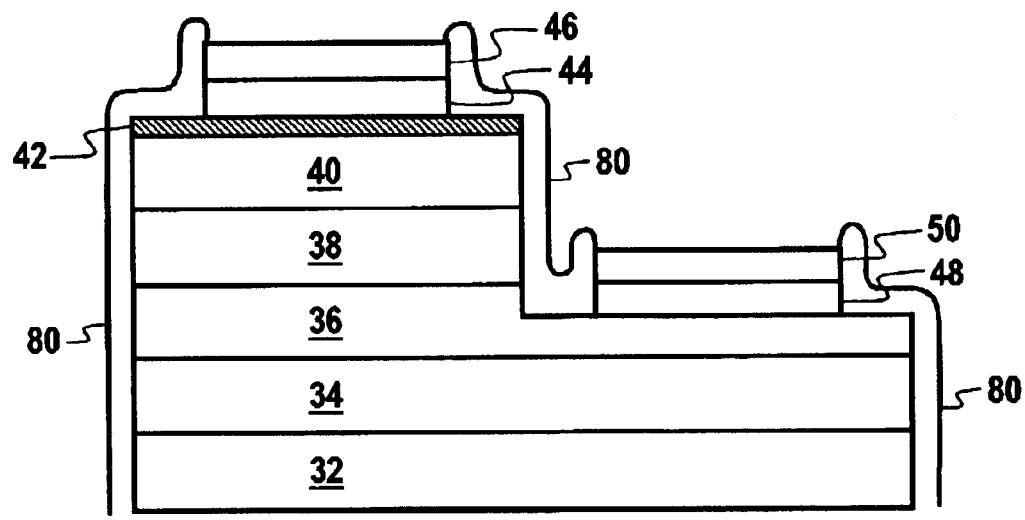
FIG. 5 illustrates the LED of FIG. 4 after patterning of the passivation material.

Referring now to FIG. 5, the passivation layer 80 is then patterned to expose the p and n contact pads 46 and 50 using a suitable etchant. For example, BOE, HF, and/or photoresist stripping can be used to expose the pads.

Figure 6:
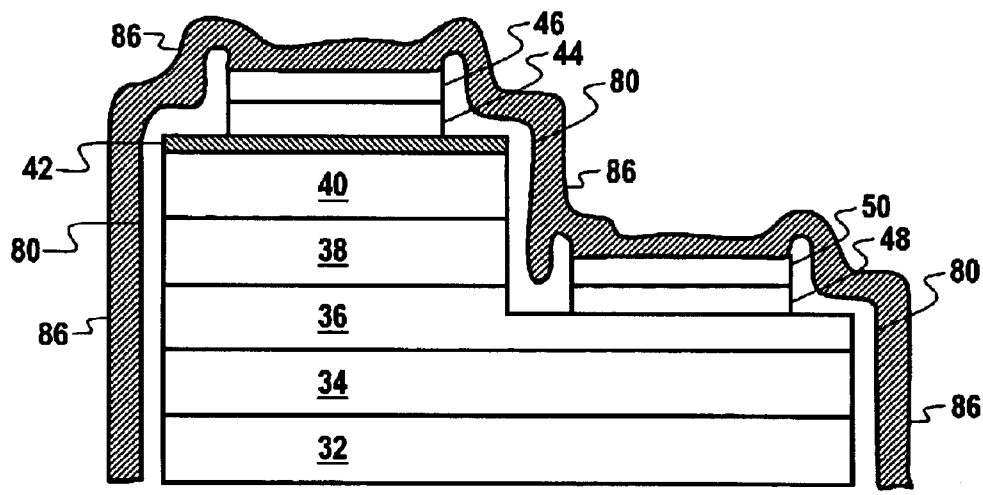
FIG. 6 illustrates the LED of FIG. 5 after forming of a yellow thin film layer.

Then, as shown in FIG. 6, a tinted thin-film layer 86 having a yellow tint is formed on the passivation layer 80 so as to cover the blue-LED element. Suitable yellow materials include ZnSe, $CeO_2$, $Al_2O_3$, and $Y_2O_3$:Ce. The thin-film layer 86 is beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods.

As is well known, chemical vapor deposition methods use precursors as elemental sources. The thin-film layer 86 can be formed using metal precursors of metal halides and of metal organic precursors such as Alkoxide, β-dikeonate, Metalloscene, and Alkys. For example, Zn sources can be DMZn or DEZn, while a Se source can be $H_2Se$, DMSe, DESe, or TbuSe.

Preferably, the thin-film layer 86 should be about 10 μm or so thick. It should be noted that the thin-film layer 86 forms a layer of the chip being fabricated. Thus, the thin-film layer 86 is an integral element of the chip, not part of a package. Regarding the film thickness, in general the thinner the better. The thickness can be reduced by growing dense yellow tinted thin films. Careful attention to detail, as well as innovative thin film deposition materials and methods will be beneficial.

Figure 7:
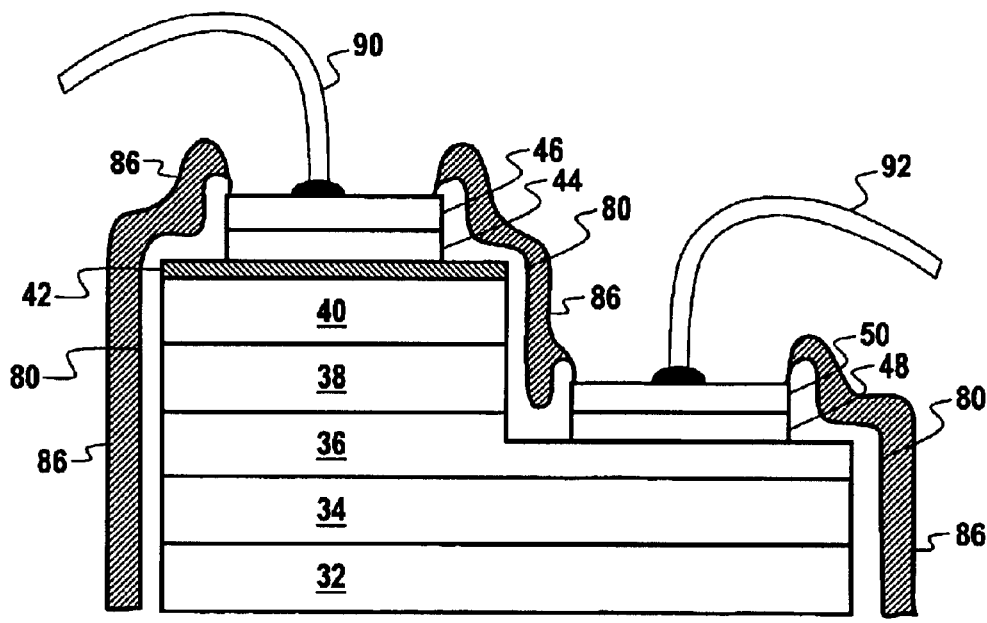
FIG. 7 illustrates the LED of FIG. 6 after patterning of the thin film layer and after bonding wires are connected.

Referring now to FIG. 7, the thin-film layer 86 is then patterned to expose the p and n contact pads 46 and 50 using a suitable solvent (which will depend on the composition of the thin-film layer 86). Bonding wires 90 and 92 are then bonded to the p and n contact pads 46 and 50, respectively.

Figure 8:
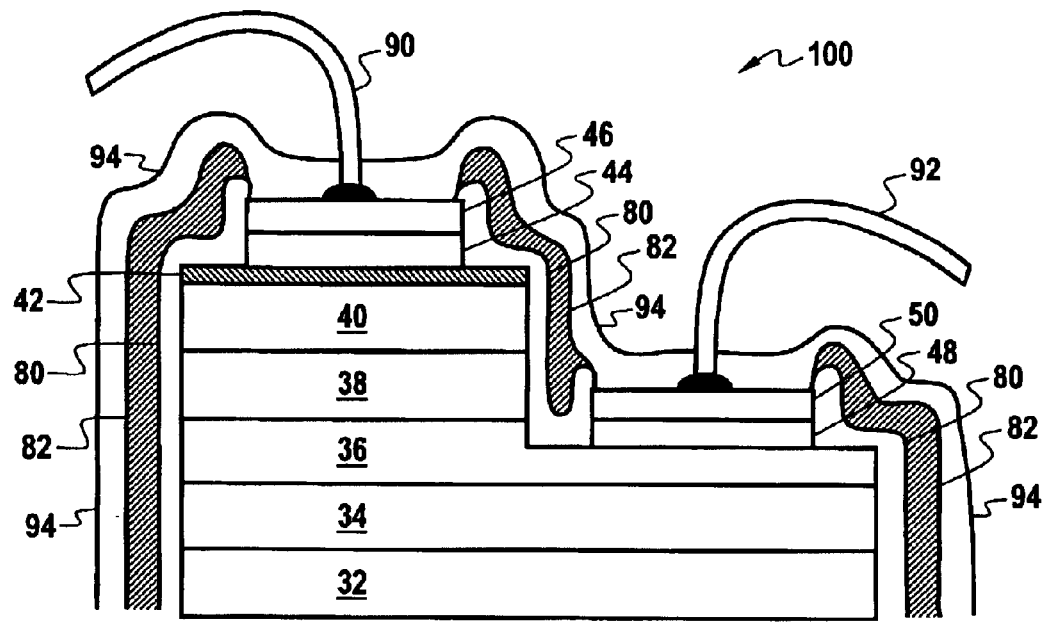
FIG. 8 illustrates the LED of FIG. 7 a second coating of a passivation material.

Referring now to FIG. 8, a second passivation layer 94 is then formed over the structure of FIG. 7. Beneficially the first and second passivation layers 80 and 94 are formed using the same process. The result is a white-LED 100.

The white LED 100 can then be encapsulated into a package, such as a lamp package or a surface mount package. However, the white LED 100 also can be used unpackaged and/or as part of another assembly.

Figure 9:
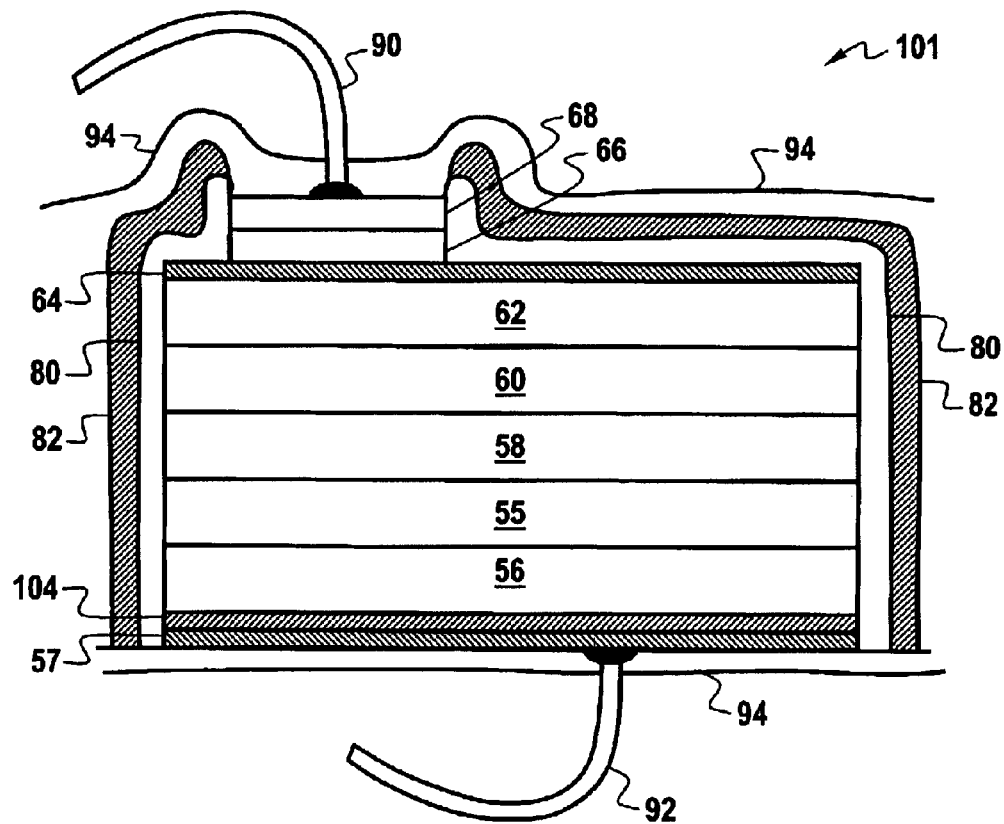
FIG. 9 illustrates an alternative embodiment LED that is in accord with the principles of the present invention.

In some applications it will be beneficial to incorporate a reflector between a contact pad and an adjacent semiconductor layer. For example, as shown in FIG. 9, if a vertical LED 54 is used as the blue light source, thus forming a white-light LED 101, it might be advantageous to incorporate a reflective layer 104 between the n-metal contact 56 and the n contact pad 57. In that case, it is advantageous to include the second passivation layer 94 under the n contact pad 57 after the bonding wire 92 is attached. Likewise, the second passivation layer 94 is beneficially over the p contact pad 68. However, is should be understood that in all cases the second passivation layer 94 is optional.

The foregoing embodiment has described a new, useful, and nonobvious white-light emitting LED 101. However, the general principles of depositing tinted thin films that impact the color of emitted light are applicable to more than just white-light LEDs. It is entirely possible to implement LEDs that emit other than white light by depositing various shades of tinted thin film layers on LEDs. Therefore, while the embodiments and examples set forth herein are presented to best explain the present invention and its practical application and to thereby enable those skilled in the art to make and utilize the invention, others who are skilled in the art will recognize that the foregoing description and examples have been presented for the purpose of illustration and example only.

What is claimed is:

1. A light emitting diode (LED), comprising:
    an LED chip having a first electrical contact and a second electrical contact, wherein the LED chip emits blue light having a first wavelength in response to applied electrical power; and
    a yellow thin-film layer over the LED chip;
    wherein the yellow thin-film layer and the blue light interact to form light having a second wavelength.

2. An LED according to claim 1, wherein the yellow thin-film layer is selected from a group consisting of ZnSe, $CeO_2$, $Al_2O_3$, and $Y_2O_3$:Ce.

3. An LED according to claim 1, further including an inner passivation layer disposed between the yellow thin-film layer and the LED chip.

4. An LED according to claim 1, wherein the yellow thin-film layer and the blue light interact to form white light.

5. An LED according to claim 1, further comprising an outer passivation layer over the yellow thin-film layer.

6. An LED according to claim 1, further comprising a first bonding wire connected to the first electrical contact and a second bonding wire connected to the second electrical contact.

7. An LED according to claim 1, wherein the LED chip has a lateral topology structure.

8. An LED according to claim 7, wherein the LED chip includes:
    a substrate;
    an n-type GaN structure on a second surface of the substrate;
    an active layer having at least one quantum well on the n-GaN structure;
    a p-type GaN layer on the active layer;
    a transparent conductive layer on the p-type GaN layer;
    a p-type electrical contact on the transparent conductive layer; and
    an n-type electrical contact on the n-type GaN structure.

9. An LED according to claim 8, wherein the p-type electrical contact forms the first electrical contact and the n-type electrical contact forms the second electrical contact.

10. An LED according to claim 8, wherein the n-type GaN structure includes an n-type GaN buffer layer.

11. An LED according to claim 8, wherein the substrate is sapphire.

12. An LED according to claim 1, wherein the LED chip has a vertical topology structure.

13. An LED according to claim 12, wherein the LED chip includes:
    an n-type GaN structure;
    an n-type electrical contact adjacent a surface of the n-type GaN structure;
    an active layer having at least one quantum well on the n-type GaN structure;
    a p-type GaN layer on the active layer;
    a transparent conductive layer on the p-type GaN layer; and
    a p-type electrical contact on the transparent conductive layer.

14. An LED according to claim 13, wherein the p-type electrical contact forms the first electrical contact and the n-type electrical contact forms the second electrical contact.

15. An LED according to claim 13, wherein the n-type GaN structure includes an n-type GaN buffer layer.

16. An LED according to claim 3, wherein the inner passivation includes $SiO_2$.

17. An LED according to claim 3, wherein the inner passivation includes $Si_xN_y$.

18. An LED according to claim 1, further including a package the environmentally protects the LED chip.

19. A method of fabricating a white-light LED, comprising:
    procuring an LED chip that emits blue-light at a first wavelength, wherein the LED chip includes a first electrical contact and a second electrical contact;
    forming a yellow thin-film layer over the LED chip; and
    producing light having at least a second wavelength by passing electrical current through the first and second electrical contacts.

20. A method of fabricating a white-light LED according to claim 19, wherein forming the yellow thin-film layer is performed by depositing a material selected from a group consisting of ZnSe, $CeO_2$, $Al_2O_3$, and $Y_2O_3$:Ce.

21. A method of fabricating a white-light LED according to claim 20, wherein forming the yellow thin-film layer is performed by chemical vapor deposition.

22. A method of fabricating a white-light LED according to claim 21, wherein the chemical vapor deposition process is selected from a group consisting of metal organic chemical vapor deposition (MOCVD), atomic layer chemical vapor deposition (ALD), plasma enhanced MOCVD, plasma enhanced ALD, low pressure CVD, photo enhanced CVD and CVD.

23. A method of fabricating a white-light LED according to claim 21, wherein chemical vapor deposition is performed using a metal precursor of a metal halide.

24. A method of fabricating a white-light LED according to claim 21, wherein chemical vapor deposition process is performed using a metal organic precursor.

25. A method of fabricating a white-light LED according to claim 21, wherein chemical vapor deposition is performed using a material selected from a group consisting of Alkoxide, β-dikeonate, Metalloscene, Alkys, DMZn, DEZn, $H_2Se$, DMSe, TbuSe, and DESe.

26. A method of fabricating a white-light LED according to claim 21, further including the step of forming an inner passivation layer between the LED chip and the yellow thin-film layer.

27. A method of fabricating a white light LED according to claim 26, wherein forming the inner passivation layer includes forming a $SiO_2$ layer.

28. A method of fabricating a white light LED according to claim 26, wherein forming the inner passivation layer includes forming a $Si_xN_y$ layer.

29. A method of fabricating a white light LED according to claim 21, further including forming an outer passivation layer over the yellow thin-film layer.

30. A method of fabricating a white light LED according to claim 21, further including bonding a first bonding wire to the first electrical contact and bonding a second bonding wire to the second electrical.

31. A method of fabricating a white light LED according to claim 21, further including sealing the LED chip in a package.

32. A light emitting diode (LED), comprising:

an LED chip having a first electrical contact and a second electrical contact, wherein the LED chip emits light having a first wavelength in response to an applied electrical power; and a tinted thin-film layer over the LED chip;

wherein the tinted thin-film layer interacts with the first wavelength light to produce a second wavelength.

33. An LED according to claim 32, wherein the tinted thin-film layer is selected from a group consisting of ZnSe, $CeO_2$, $Al_2O_3$, and $Y_2O_3$:Ce.

34. An LED according to claim 32, further including an inner passivation layer between the tinted thin-film layer and the LED chip.

35. An LED according to claim 32, wherein the first wavelength light is converted to white light.

36. An LED according to claim 32, further comprising an outer passivation layer over the tinted thin-film layer.

37. An Led according to claim 32, further comprising a first bonding wire connected to the first electrical contact and a second bonding wire connected to the second electrical contact.

38. An Led according to claim 32, wherein the LED chip has a lateral topology structure.

39. An Led according to claim 32, wherein the LED chip has a vertical topology structure.

* * * * *